United States Patent
Xu

(10) Patent No.: US 9,722,210 B2
(45) Date of Patent: Aug. 1, 2017

(54) OLED LIGHT EMITTING DEVICE AND DISPLAY DEVICE

(71) Applicant: Shenzhen China Star Optoelectronics Technology Co., Ltd., Shenzhen (CN)

(72) Inventor: Chao Xu, Shenzhen (CN)

(73) Assignee: Shenzhen China Star Optoelectronics Technology Co., Ltd., Shenzhen (CN)

( * ) Notice: Subject to any disclaimer, the term of this patent is extended or adjusted under 35 U.S.C. 154(b) by 0 days.

(21) Appl. No.: 14/890,589

(22) PCT Filed: Oct. 20, 2015

(86) PCT No.: PCT/CN2015/092308
§ 371 (c)(1),
(2) Date: Nov. 12, 2015

(87) PCT Pub. No.: WO2017/049685
PCT Pub. Date: Mar. 30, 2017

(65) Prior Publication Data
US 2017/0084872 A1    Mar. 23, 2017

(30) Foreign Application Priority Data
Sep. 22, 2015  (CN) .......................... 2015 1 0608837

(51) Int. Cl.
*H01L 51/52* (2006.01)
*H01L 51/00* (2006.01)

(52) U.S. Cl.
CPC ...... *H01L 51/5275* (2013.01); *H01L 51/0035* (2013.01); *H01L 51/5206* (2013.01); *H01L 51/5221* (2013.01)

(58) Field of Classification Search
CPC . H01L 51/52; H01L 51/5268; H01L 51/5271; H01L 51/5275
See application file for complete search history.

(56) References Cited

U.S. PATENT DOCUMENTS 8,547,015 B2 * 10/2013 Wolk ...................... B32B 27/08
                                                        313/503
9,281,501 B2 *  3/2016 Chen .................... G02B 3/0056
9,366,787 B2 *  6/2016 Lu ......................... G02B 5/0242

* cited by examiner

*Primary Examiner* — Phuc Dang

(57) ABSTRACT

An OLED light emitting device and a display device are provided. The OLED light emitting device has a cathode, a light-emitting layer, an anode, a substrate, and a light extraction layer; the light extraction layer at least has a first material layer and a second material layer; a first contact surface of the first material layer and a second contact surface of the second material layer contact each other; a longitudinal section of the first contact surface and that of the second contact surface have sawtooth portions fitted with each other; $n_A > n_{substrate} > n_B$.

18 Claims, 2 Drawing Sheets

OLED LIGHT EMITTING DEVICE AND DISPLAY DEVICE

RELATED APPLICATIONS

This application is a National Phase of PCT Patent Application No. PCT/CN2015/092308 having International filing date of Oct. 20, 2015, which claims the benefit of priority of Chinese Patent Application No. 201510608837.9 filed on Sep. 22, 2015. The contents of the above applications are all incorporated by reference as if fully set forth herein in their entirety.

FIELD OF THE INVENTION

The present invention relates to a technical field of displays, and in particular to an OLED light emitting device and a display device.

BACKGROUND OF THE INVENTION

Recently, organic light-emitting diodes have had many advantages, such as being self-luminous, having a wide view angle, fast response, high contrast, low energy consumption, being green, having a long life, being ultra-thin, and having a flexible display, which could be focused on next-generation display technology.

Refer to FIG. 1, a typical OLED light emitting device comprises a glass substrate 10, an indium tin oxide (ITO) anode 20, an organic light-emitting layer 30, and a cathode 40; the organic light-emitting layer 30 is sandwiched between the ITO anode 20 and the metal cathode 40. The holes of the anode 20 and the electrons of the cathode 40 are combined in the organic light-emitting layer 30 by at applying a voltage, a light A1 could be generated by stimulating the organic material.

However, most of the light A1 cannot output an emitting surface of the OLED light emitting device and emit to a side of the emitting surface due to the influence of the reflection and the refraction between the glass substrate 10 and the surface layer of the air area, so that a ratio of the light outputted from the emitting surface and all of the light A1 emitted from the light-emitting layer 30 (light-emitting efficiency of the OLED light emitting device) is lower, and the development of the OLED light emitting device could be limited. Therefore, improving the light-emitting efficiency of the OLED light emitting device is an urgent problem.

SUMMARY OF THE INVENTION

A primary object of the present invention is to provide an OLED light emitting device and a display device, which solves the traditional OLED light emitting device with low light-emitting efficiency, and insufficient brightness.

To achieve the above object, the present invention provides an OLED light emitting device which comprises a cathode, a light-emitting layer, an anode, a substrate, and a light extraction layer; wherein the light-emitting layer is located between the cathode and the anode; the substrate is located between the anode and the light extraction layer; a top surface and a bottom surface of the light extraction layer are flat surfaces, and the light extraction layer at least includes a first material layer and a second material layer; the first material layer is located on the substrate; the second material layer is located on the first material layer; a first contact surface of the first material layer and a second contact surface of the second material layer contact with each other; a longitudinal section of the first contact surface and that of the second contact surface have sawtooth portions fitted with each other; and an index of refraction ($n_A$) of the first material layer, that ($n_{substrate}$) of the substrate, and that ($n_B$) of the second material layer satisfy a condition: $n_A > n_{substrate} > n_B$;

wherein the sawtooth portions comprise a plurality of isosceles triangles; and a bottom edge of each of the isosceles triangles of the first material layer is coincided with a surface of the substrate; and wherein the light extraction layer further includes a third material layer; the third material layer is located on the second material layer; and an index of refraction ($n_C$) of the third material layer and that ($n_B$) of the second material satisfy a condition:

$n_C < n_B$.

Furthermore, a bottom angle of each of the isosceles triangles of the first material layer is defined according to the index of refraction of the first material layer.

To achieve the above object, the present invention further provides an OLED light emitting device which comprises a cathode, a light-emitting layer, an anode, a substrate and a light extraction layer; wherein the light-emitting layer is located between the cathode and the anode; the substrate is located between the anode and the light extraction layer; a top surface and a bottom surface of the light extraction layer are flat surfaces, and the light extraction layer at least includes a first material layer and a second material layer; the first material layer is located on the substrate; the second material layer is located on the first material layer; a first contact surface of the first material layer and a second contact surface of the second material layer contacted with each other; a longitudinal section of the first contact surface and that of the second contact surface have sawtooth portions fitted with each other; and an index of refraction ($n_A$) of the first material layer, that ($n_{substrate}$) of the substrate, and that ($n_B$) of the second material layer satisfy a condition: $n_A > n_{substrate} > n_B$.

Furthermore, the sawtooth portions comprise a plurality of isosceles triangles, and a bottom edge of each of the isosceles triangles of the first material layer coincides with a surface of the substrate.

Furthermore, a bottom angle of each of the isosceles triangle of the first material layer is defined according to the index of refraction of the first material layer.

Furthermore, the light extraction layer further includes a third material layer; the third material layer is located on the second material layer; and an index of refraction ($n_C$) of the third material layer and that ($n_B$) of the second material layer satisfy a condition: $n_C < n_B$.

Furthermore, the first material layer is formed on the substrate by imprinting.

Furthermore, the second material layer is formed on the first material layer by coating, and a top surface of the second material layer is a flat surface.

Furthermore, the first material layer is made of polycarbonate.

Furthermore, the OLED light emitting device further comprises a light gathering layer sandwiched between the substrate and the anode; a third contact surface of the light gathering layer and a fourth contact surface of the anode contact with each other; a longitudinal section of the third contact surface and that of the fourth contact surface have sawtooth portions fitted with each other; and an index of refraction ($n_1$) of the light gathering layer and that ($n_N$) of anode used satisfy a condition: $n_1 > n_N$.

Furthermore, the anode is deposited on the light gathering layer by chemical vapor deposition, and a surface of the light gathering layer near the substrate is a flat surface.

To achieve the above object, the present invention further provides an OLED display device, which comprises an OLED light emitting device; wherein the OLED light emitting device includes a cathode, a light-emitting layer, an anode, a substrate and a light extraction layer; the light-emitting layer is located between the cathode and the anode; the substrate is located between the anode and the light extraction layer; a top surface and a bottom surface of the light extraction layer are flat surfaces and the light extraction layer at least includes a first material layer and a second material layer; the first material layer is located on the substrate; the second material layer is located on the first material layer; a first contact surface of the first material layer and a second contact surface of the second material layer contact with each other; a longitudinal section of the first contact surface and that of the second contact surface have sawtooth portions fitted with each other; and an index of refraction ($n_A$) of the first material layer, that ($n_{substrate}$) of the substrate, and that ($n_B$) of the second material layer satisfy a condition: $n_A > n_{substrate} > n_B$.

Furthermore, the sawtooth portions comprise a plurality of isosceles triangles, and a bottom edge of each of the isosceles triangles of the first material layer coincides with a surface of the substrate.

Furthermore, a bottom angle of each of the isosceles triangle of the first material layer is defined according to the index of refraction of the first material layer.

Furthermore, the light extraction layer further includes a third material layer; the third material layer locates on the second material layer; and an index of refraction ($n_C$) of the third material layer and that ($n_B$) of the second material satisfy a condition:

$$n_C < n_B.$$

Furthermore, the first material layer is formed on the substrate by imprinting.

Furthermore, the second material layer is formed on the first material layer by coating, and a top surface of the second material layer is a flat surface.

Furthermore, the first material layer is made of polycarbonate.

Furthermore, the OLED light emitting device further comprises a light gathering layer sandwiched between the substrate and the anode; a third contact surface of the light gathering layer and a fourth contact surface of the anode contact with each other; a longitudinal section of the third contact surface and that of the fourth contact surface have sawtooth portions fitted with each other; and an index of refraction ($n_1$) of the light gathering layer and that ($n_N$) of anode satisfy a condition: $n_1 > n_N$.

Furthermore, the anode is deposited on the light gathering layer by chemical vapor deposition, and a surface of the light gathering layer near the substrate is a flat surface.

The beneficial effects of the present invention include: in the OLED light emitting device and the display device of the present invention, the first contact surface of the first material layer and the second contact surface of the second material layer are disposed on the substrate; the longitudinal section of the first contact surface and that of the second contact surface have sawtooth portions fitted with each other; the index of refraction ($n_A$) of the first material layer, that ($n_{substrate}$) of the substrate and that ($n_B$) of the second material layer satisfy a condition: $n_A > n_{substrate} > n_B$, so that the light outputted from a side of the anode can be reduced, and the light emitted from the emitting surface of the OLED light emitting device can be increased, so as to improve the light-emitting efficiency of the OLED light emitting device.

DESCRIPTION OF SPECIFIC EMBODIMENTS OF THE INVENTION

In order to solve the technical problem by the present invention, technical solutions and beneficial effects will be more apparent below in conjunction with the accompanying drawings and embodiments of the present invention will be described in further detail. It should be understood that the specific embodiments described herein are merely for explaining the present invention and are not intended to limit the present invention.

Figure 1:
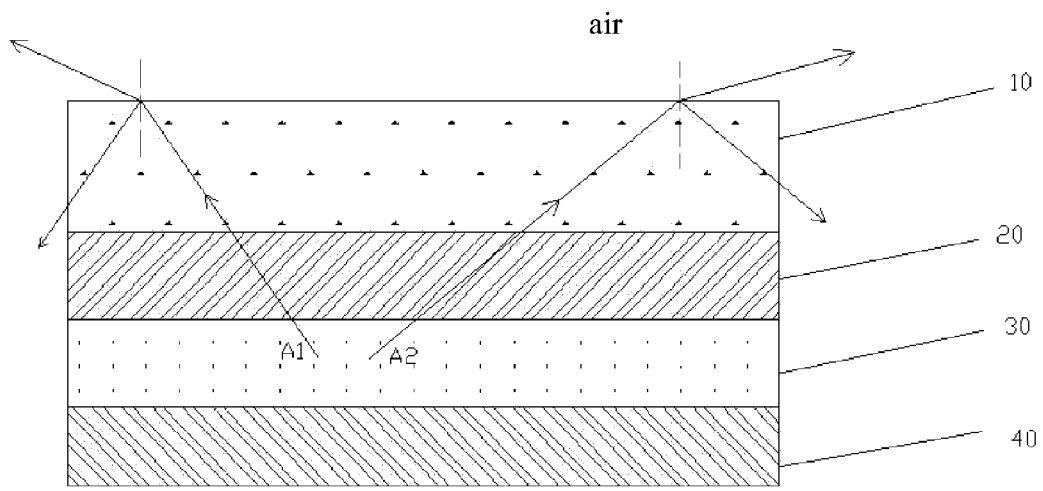
FIG. 1 is a schematic view of a transmission route of the light in a typical OLED light emitting device.
Figure 2:
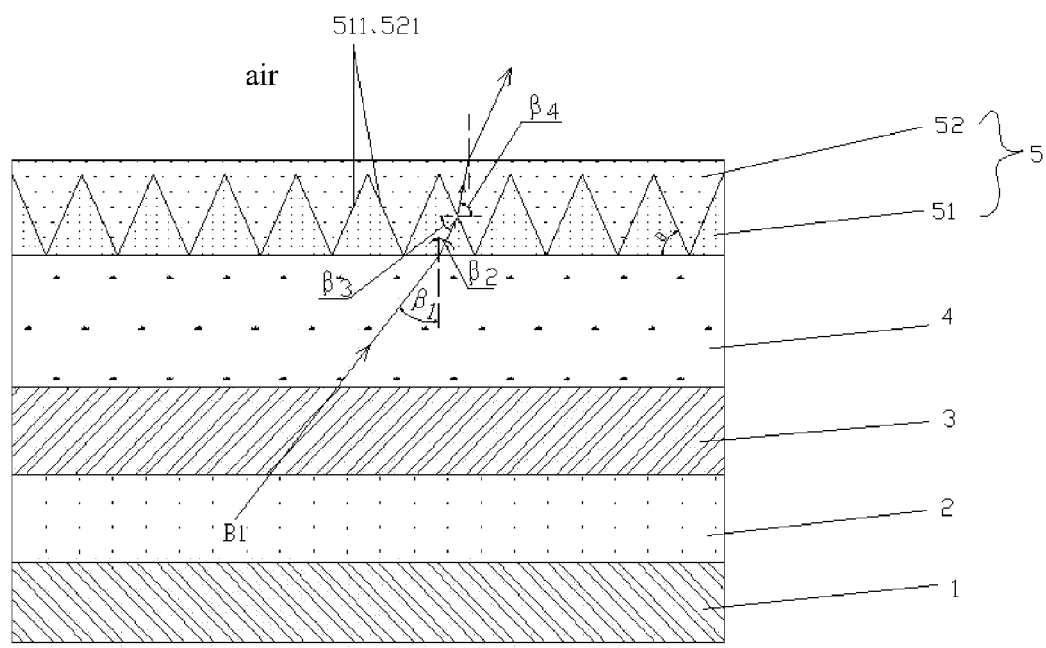
FIG. 2 is a schematic view of a transmission route of the light in an OLED light emitting device according to a first embodiment of the present invention.

Refer to FIG. 2, the present invention provides an OLED light emitting device to a first embodiment which comprises a cathode 1, a light-emitting layer 2, an anode 3, a substrate 4, and a light extraction layer 5; wherein the light-emitting layer 2 is located between the cathode 1 and the anode 3; the substrate 4 is located between the anode 3 and the light extraction layer 5; a top surface and a bottom surface of the light extraction layer 5 are flat surfaces; the light extraction layer 5 at least includes a first material layer 51 and a second material layer 52; the first material layer 51 is located on the substrate 4; the second material layer 52 is located on the first material layer 51; a first contact surface 511 of the first material layer 51 and a second contact surface 521 of the second material layer 52 are contacted with each other; a longitudinal section of the first contact surface 511 and that of the second contact surface 521 have sawtooth portions fitted with each other; an index of refraction ($n_A$) of the first material layer 51, that ($n_{substrate}$) of the substrate 4, and that ($n_B$) of the second material layer 52 satisfy a condition: $n_A > n_{substrate} > n_B$; wherein $n_A : n_{substrate} = \sin \beta_1 : \sin \beta_2$, $n_A : n_B = \sin \beta_4 : \sin \beta_3$, $\beta_1$ and $\beta_2$ are the incident angle and the angle respectively under the light B1 emits in the first material layer 51 from the substrate 4; $\beta_3$ and $\beta_4$ are the incident angle and the angle respectively under the light B1 emits in the second material layer 52 from the first material layer 51.

In the embodiment, the sawtooth portions comprise a plurality of isosceles triangles, and a bottom edge of each of the isosceles triangles of the first material layer 51 coincides with a surface of the substrate 4; a bottom angle θ of each of the isosceles triangle of the first material layer 51 is defined according to the index of refraction of the first material layer 51; the substrate 4 is a glass plate or a quartz substrate; the index of refraction of the substrate 4 is 1.52 to 1.53; the first material layer 51 is made of polycarbonate; the index of refraction of the first material layer 51 is 1.58 to 1.59, and the transmittance is greater than 90%; the second material layer 52 is made of polymethyl methacrylate; the index of refraction of the second material 52 is 1.49, and the transmittance is greater than 92%.

During the production process, the anode 3 is deposited on the cleaning substrate 4 by RF sputtering at first, and makes a surface of the anode 3 smooth; the material of the anode 3 is indium tin oxide (ITO); after that the light-emitting layer 2 and the cathode 1 are formed on the anode 3 successively through the vacuum deposition; the light-emitting layer 2 is made of an organic material with high luminous efficiency; the material of the cathode 1 comprises Ag, Al, or Mg; finally, the first material layer 51 is formed on the substrate 4 by imprinting; the second material layer 52 is formed on the first material layer 51 by coating to ensure that a top surface of the second material layer 52 is a flat surface.

Applying a voltage between the anode 3 and the cathode 1, the light B1 is generated by stimulating the light-emitting layer 2; the light B1 is emitted to the first material layer 51 and the second material layer 52 from the substrate 4, and outputted to air from the second material layer 52. The longitudinal section of the first contact surface 511 and that of the second contact surface 521 have sawtooth portions fitted with each other, and the index of refraction ($n_A$) of the first material layer 51, that ($n_{substrate}$) of the substrate 4, and that ($n_B$) of the second material layer 52 satisfy a condition: $n_A > n_{substrate} > n_B$. Thus, the transmission direction of the light B1 emitted in the first material layer 51 can be changed maximum to approach a middle of the second material layer 52.

Figure 3:
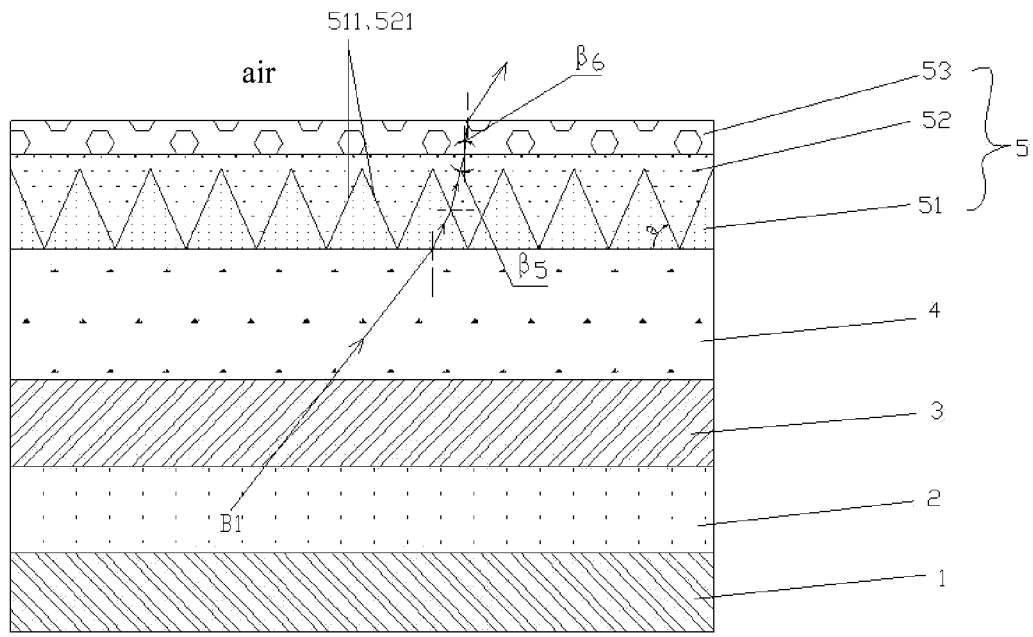
FIG. 3 is a schematic view of a transmission route of the light in an OLED light emitting device according to a second embodiment of the present invention.

In another embodiment, the light extraction layer 5 further comprises a third material layer 53 for making the light B1 to approach the middle; the third material layer 53 is located on the second material layer 52; an index of refraction ($n_C$) of the third material layer and that ($n_B$) of the second material satisfy a condition: $n_C < n_B$. Refer to FIG. 3, $n_B : n_C = \sin \beta_6 : \sin \beta_5$; $\beta_5$ and $\beta_6$ are the incident angle and the angle respectively under the light B1 emits in the third material layer 53 from the second material layer 52.

Figure 4:
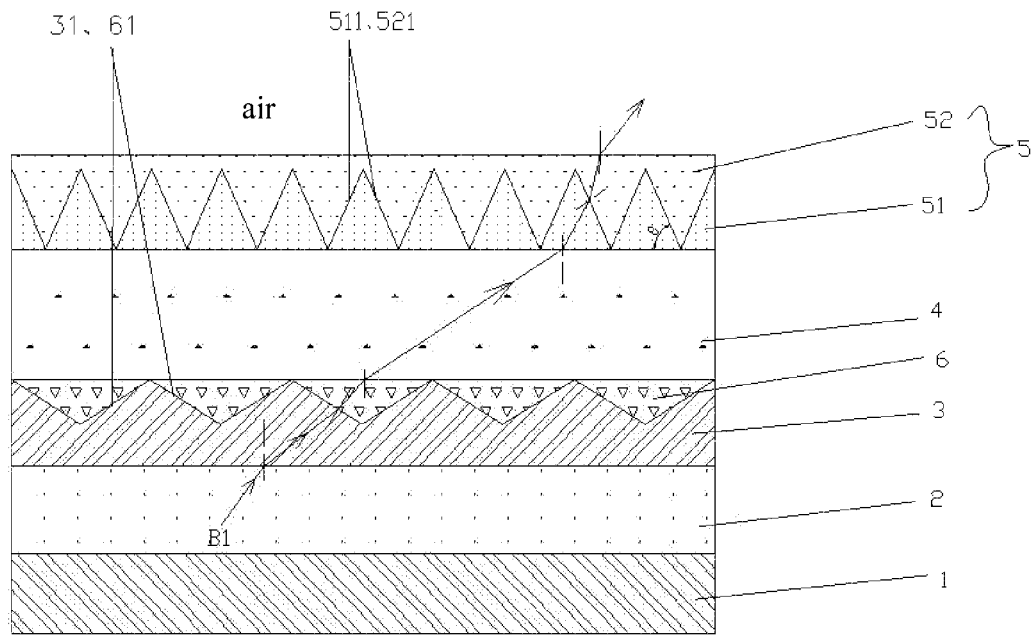
FIG. 4 is a schematic view of a transmission route of the light in an OLED light emitting device according to a third embodiment of the present invention.

In another embodiment, the OLED light emitting device further comprises a light gathering layer 6 for reducing the influence of the reflection and the refraction between the anode 3 and the surface layer of a glass substrate 10 to prevent the light from escaping from a side of the anode 3; the light gathering layer 6 is sandwiched between the substrate 4 and the anode 3; a third contact surface 61 of the light gathering layer 6 and a fourth contact surface 31 of the anode 3 are contacted with each other; a longitudinal section of the third contact surface 61 and that of the fourth contact surface 31 have sawtooth portions fitted with each other; an index of refraction ($n_1$) of the light gathering layer 6 and that of anode 3 satisfy a condition: $n_1 > n_N$. Refer to FIG. 4, the anode 3 is deposited on the light gathering layer 6 by chemical vapor deposition, and a surface of the light gathering layer 6 near the substrate 4 is a flat surface in the embodiment. The light gathering layer 6 is made of the material with a high transmittance and a high refractive index, such as ZnO, or $TiO_2$.

In addition, the present invention further provides an OLED display device (not shown), which has said OLED light emitting device. The display device can be any product or device with display function, such as TV, display, digital photo frame, mobile phone, and tablet (not shown).

In the OLED light emitting device and the display device of the present invention, the first contact surface 511 of the first material layer 51 and the second contact surface 521 of the second material layer 52 are disposed on the substrate 4; the longitudinal section of the first contact surface 511 and that of the second contact surface 521 have sawtooth portions fitted with each other; the index of refraction ($n_A$) of the first material layer 51, that ($n_{substrate}$) of the substrate 4, and that ($n_B$) of the second material layer 52 satisfy a condition: $n_A > n_{substrate} > n_B$. Thus, the light B1 outputted from a side of the anode 3 can be reduced, and the light B1 emitted from the emitting surface of the OLED light emitting device can be increased, so as to improve the light-emitting efficiency of the OLED light emitting device.

The foregoing are only preferred embodiments of the present invention only, and are not intended to limit the present invention. Any modifications made within the spirit and principles of the present invention, equivalent replacements and improvements, etc., should be included in the protection of the present invention within the range.

What is claimed is:

1. An OLED light emitting device, comprising:
   a cathode, a light-emitting layer, an anode, a substrate, and a light extraction layer; the light-emitting layer being located between the cathode and the anode; the substrate being located between the anode and the light extraction layer; a top surface and a bottom surface of the light extraction layer being flat surfaces, and the light extraction layer at least including a first material layer and a second material layer; the first material layer being located on the substrate; the second material layer located on the first material layer; a first contact surface of the first material layer and a second contact surface of the second material layer being contacted with each other; a longitudinal section of the first contact surface and that of the second contact surface having sawtooth portions fitted with each other; and an index of refraction ($n_A$) of the first material layer, that ($n_{substrate}$) of the substrate, and that ($n_B$) of the second material layer satisfying:

$n_A > n_{substrate} > n_B$;

wherein the sawtooth portions comprise a plurality of isosceles triangles; and a bottom edge of each of the isosceles triangles of the first material layer coincides with a surface of the substrate; and
   wherein the light extraction layer further includes a third material layer; the third material layer is located on the second material layer; and an index of refraction ($n_C$) of the third material layer and that ($n_B$) of the second material layer satisfy:

$n_C < n_B$.

2. The OLED light emitting device according to claim 1, wherein a bottom angle of each of the isosceles triangles of the first material layer is defined according to the index of refraction of the first material layer.

3. An OLED light emitting device, comprising:
   a cathode, a light-emitting layer, an anode, a substrate, and a light extraction layer; the light-emitting layer being located between the cathode and the anode; the substrate being located between the anode and the light extraction layer; a top surface and a bottom surface of the light extraction layer being flat surfaces, and the light extraction layer at least including a first material layer and a second material layer; the first material layer being located on the substrate; the second material layer being located on the first material layer; a first contact surface of the first material layer and a second contact surface of the second material layer being contacted with each other; a longitudinal section of the first contact surface and that of the second contact surface having sawtooth portions fitted with each other; and an index of refraction ($n_A$) of the first material layer, that ($n_{substrate}$) of the substrate, and that ($n_B$) of the second material layer satisfying:

$n_A > n_{substrate} > n_B$;

wherein the sawtooth potions comprise a plurality of isosceles triangles, and a bottom edge of each of the isosceles triangles of the first material layer coincides with a surface of the substrate.

4. The OLED light emitting device according to claim 3, wherein a bottom angle of each of the isosceles triangle of the first material layer is defined according to the index of refraction of the first material layer.

5. The OLED light emitting device according to claim 3, wherein the light extraction layer further includes a third material layer; the third material layer is located on the second material layer; and an index of refraction ($n_C$) of the third material layer and that ($n_B$) of the second material layer satisfy: $n_C < n_B$.

6. The OLED light emitting device according to claim 3, wherein the first material layer is formed on the substrate by imprinting.

7. The OLED light emitting device according to claim 3, wherein the second material layer is formed on the first material layer by coating, and a top surface of the second material layer is a flat surface.

8. The OLED light emitting device according to claim 3, wherein the first material layer is made of polycarbonate.

9. The OLED light emitting device according to claim 3, wherein the OLED light emitting device further comprises a light gathering layer sandwiched between the substrate and the anode; a third contact surface of the light gathering layer and a fourth contact surface of the anode are contacted with each other; a longitudinal section of the third contact surface and that of the fourth contact surface having sawtooth portions fitted with each other; and an index of refraction ($n_1$) of the light gathering layer and that ($n_N$) of anode used satisfy:

$n_1 > n_N$.

10. The OLED light emitting device according to claim 9, wherein the anode is deposited on the light gathering layer by chemical vapor deposition, and a surface of the light gathering layer near the substrate is a flat surface.

11. An OLED display device, comprising:
an OLED light emitting device including a cathode, a light-emitting layer, an anode, a substrate, and a light extraction layer; the light-emitting layer being located between the cathode and the anode; the substrate being located between the anode and the light extraction layer; a top surface and a bottom surface of the light extraction layer being flat surfaces and the light extraction layer at least including a first material layer and a second material layer; the first material layer being located on the substrate; the second material layer being located on the first material layer; a first contact surface of the first material layer and a second contact surface of the second material layer contact with each other; a longitudinal section of the first contact surface and that of the second contact surface having sawtooth portions fitted with each other; and an index of refraction ($n_A$) of the first material layer, that ($n_{substrate}$) of the substrate, and that ($n_B$) of the second material layer satisfying: $n_A > n_{substrate} > n_B$;
wherein the sawtooth portions comprise a plurality of isosceles triangles, and a bottom edge of each of the isosceles triangles of the first material layer coincides with a surface of the substrate.

12. The OLED display device according to claim 11, wherein a bottom angle of each of the isosceles triangle of the first material layer is defined according to the index of refraction of the first material layer.

13. The OLED display device according to claim 11, wherein the light extraction layer further includes a third material layer; the third material layer is located on the second material layer; and an index of refraction ($n_C$) of the third material layer and that ($n_B$) of the second material layer satisfy: $n_C < n_B$.

14. The OLED display device according to claim 11, wherein the first material layer is formed on the substrate by imprinting.

15. The OLED display device according to claim 11, wherein the second material layer is formed on the first material layer by coating, and a top surface of the second material layer is a flat surface.

16. The OLED display device according to claim 11, wherein the first material layer is made of polycarbonate.

17. The OLED display device according to claim 11, wherein the OLED light emitting device further comprises a light gathering layer sandwiched between the substrate and the anode; a third contact surface of the light gathering layer and a fourth contact surface of the anode contact with each other; a longitudinal section of the third contact surface and that of the fourth contact surface having sawtooth portions fitted with each other; and an index of refraction ($n_1$) of the light gathering layer and that ($n_N$) of anode satisfy: $n_1 > n_N$.

18. The OLED display device according to claim 17, wherein the anode is deposited on the light gathering layer by chemical vapor deposition, and a surface of the light gathering layer near the substrate is a flat surface.

* * * * *